United States Patent
Liu et al.

(10) Patent No.: US 8,427,884 B2
(45) Date of Patent: Apr. 23, 2013

(54) BIT SCAN CIRCUITS AND METHOD IN NON-VOLATILE MEMORY

(75) Inventors: Bo Liu, Milpitas, CA (US); Jongmin Park, Cupertino, CA (US); Chen Chen, Mountain View, CA (US); Tien-chien Kuo, Sunnyvale, CA (US)

(73) Assignee: SanDisk Technologies, Inc., Plano, TX (US)

( * ) Notice: Subject to any disclaimer, the term of this patent is extended or adjusted under 35 U.S.C. 154(b) by 120 days.

(21) Appl. No.: 13/164,618

(22) Filed: Jun. 20, 2011

(65) Prior Publication Data

US 2012/0321032 A1  Dec. 20, 2012

(51) Int. Cl.
*G11C 7/10* (2006.01)

(52) U.S. Cl.
USPC ............ 365/189.05; 365/185.18; 365/185.22; 365/185.23; 365/189.011; 365/189.16; 365/189.17; 365/189.07; 365/189.12

(58) Field of Classification Search ............. 365/185.18, 365/185.22, 185.23, 189.011, 189.16, 189.17, 365/189.05, 189.07, 189.12
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan et al. | |
| 5,903,495 A | 5/1999 | Takeuchi et al. | |
| 6,011,725 A | 1/2000 | Eitan | |
| 6,046,935 A | 4/2000 | Takeuchi et al. | |
| 6,185,709 B1 | 2/2001 | Dreibelbis | |
| 6,222,762 B1 | 4/2001 | Guterman et al. | |
| 7,471,575 B2 | 12/2008 | Cernea et al. | |
| 2008/0022176 A1 | 1/2008 | Anzou | |
| 2010/0172180 A1 | 7/2010 | Paley et al. | |
| 2010/0329029 A1* | 12/2010 | Yun et al. | 365/185.22 |
| 2012/0173924 A1* | 7/2012 | Xiao et al. | 714/15 |

OTHER PUBLICATIONS

Notification of Transmittal of the International Search Report and the Written Opinion of the International Searching Authority, or the Declaration for International Application No. PCT/US2012/040145 mailed Aug. 31, 2012, 11 pages.
Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner* — Fernando Hidalgo
(74) *Attorney, Agent, or Firm* — Davis Wright Tremaine LLP

(57) ABSTRACT

A circuit for counting in an N-bit string a number of bits M, having a first binary value includes N latch circuits in a daisy chain where each latch circuit has a tag bit that controls each to be either in a no-pass or pass state. Initially the tag bits are set according to the bits of the N-bit string where the first binary value corresponds to a no-pass state. A clock signal having a pulse train is run through the daisy chain to "interrogate" any no-pass latch circuits. It races right through any pass latch circuit. However, for a no-pass latch circuit, a leading pulse while being blocked also resets after a pulse period the tag bit from "no-pass" to "pass" state to allow subsequent pulses to pass. After all no-pass latch circuits have been reset, M is given by the number of missing pulses from the pulse train.

20 Claims, 10 Drawing Sheets

RESET TIMING DIAGRAMS

LOAD BIT_x = 1 TIMING DIAGRAMS

BIT_x = 1, TIMING DIAGRAMS showing first entering pulse being blocked

BIT SCAN CIRCUITS AND METHOD IN NON-VOLATILE MEMORY

FIELD OF THE INVENTION

This application relates generally to electronic circuits and methods and more particularly, to a circuit and method for counting the number of "1" or "0" in an N-bit string useful in the operation of re-programmable non-volatile memory systems such as semiconductor flash memory.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card are ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

It is common in current commercial products for each storage element of a flash EEPROM array to store a single bit of data by operating in a binary mode, where two ranges of threshold levels of the storage element transistors are defined as storage levels. The threshold levels of transistors correspond to ranges of charge levels stored on their storage elements. In addition to shrinking the size of the memory arrays, the trend is to further increase the density of data storage of such memory arrays by storing more than one bit of data in each storage element transistor. This is accomplished by defining more than two threshold levels as storage states for each storage element transistor, four such states (2 bits of data per storage element) now being included in commercial products. More storage states, such as 16 states per storage element, are also being implemented. Each storage element memory transistor has a certain total range (window) of threshold voltages in which it may practically be operated, and that range is divided into the number of states defined for it plus margins between the states to allow for them to be clearly differentiated from one another. Obviously, the more bits a memory cell is configured to store, the smaller is the margin of error it has to operate in.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

During operations of the memory device, there arises a need to count the number of "1" or "0" in an N-bit string. For example, during a program operation, a page of binary target data is provided in a first set of data latches of the memory device. A page of, e.g., N, memory cells are then programmed in parallel according to the target data to allow the N memory cells to reach their respective target states. After programming of the page is done, the page of binary data is read back from the group of memory cells and stored in a second set of data latches. The binary data pages of the first and second sets of data latches can be compared to verify that the programming was performed correctly. Typically, an XOR operation is performed bit-by-bit between the two sets, and a "1" indicates a disagreement between the two sets. Thus, the result of the comparison is an N-bit string where any occurrence of "1"s would indicate a memory cell that fails to program correctly. Of course, in a reverse logic implementation, "0"s instead of "1"s could indicate an incorrectly programmed memory cell.

If the number of failed bits exceeds a correction capability of a built-in ECC scheme, the programming should be redone. However, in today's generation of flash memory, the data page is typically quite large, as for example, of the order of 10**5 bits. Existing circuits and methods to scan this string for occurrence of "1"s can be time and/or hardware intensive.

Thus there is a general need for more efficient and economical circuits and methods to count the instances of "1" or "0" in a bit string.

SUMMARY AND OBJECTS OF THE INVENTION

A circuit and method for counting in an N-bit string a number of bits M, having a first binary value includes N tag latch circuits in a daisy chain where each tag latch circuit has a tag bit that controls each to be either in a "no-pass" or "pass" state. Initially the tag bits are set according to the bits of the N-bit string where the first binary value corresponds to a "no-pass" state. A clock signal having a pulse train is run through the daisy chain to "interrogate" any "no-pass" tag latch circuits. It races right through any "pass" tag latch circuit. However, for a "no-pass" tag latch circuit, a leading pulse while being blocked also resets after a pulse period the tag bit from "no-pass" to "pass" state to allow subsequent pulses to pass. After all "no-pass" tag latch circuits have been reset, M is given by the number of missing pulses from the pulse train.

In one embodiment, M is determined from the number of the missing pulses which is counted from a clock signal that passes through the daisy chain.

In a more preferred embodiment, M is determined from the number of the missing pulses which is counted from a branch of the clock signal that does not passes through the daisy chain. The branch of the clock signal is gated outside the daisy chain to minimize gate delays suffered through the entire daisy chain. The gating signal is provided by the tag bits from the individual tag latches of the daisy chain.

When the number of tag latches in the daisy chain exceeds a predetermined number that may cause substantial gate delay, the daisy chain is further partitioned into subdaisy chains that are concatenated together. The clock signal emerging from each subdaisy chain has it timing corrected by a clock synchronizer before being fed to the next subdaisy chain in the concatenated chain.

The clock signal zips pass those tag latches in the "pass" state but expends one clock pulse to reset those tag latches in the "no-pass" state. Thus, when the N-bit string is expected to have M less than N−M, and M corresponds to the first binary value, performance of the bit scanning is optimized when the "no-pass" value of the tag bit is coded to be the first binary value.

This invention is advantages in that each clock cycle is devoted to count failure bits (e.g., "1" and not "0"). Conventional daisy-chained latches such as the flip-flop type have the clock signal clocking through each and every latches. If there are 100 latches, it will at least 100 clock pulses to get the count even if there are only two "1"s to be counted. The present bit scan circuit is very efficient, in that the clock signal races pass all tag latch circuits in the "pass" state and only clocks those tag latch circuits in the "no-pass" state that correspond to the "1"s of interest in the N-bit string. In the example given, only about two clock pulses are needed to complete the count.

This invention substantially improves failure bits counting speed, employs relatively simplified circuits, thereby reducing layout size and reducing power consumption. In general, it can be used for bit count in memory products and achieving the operation with fast operation and small circuit area.

Additional objects, features and advantages of the present invention will be understood from the following description of its preferred embodiments, which description should be taken in conjunction with the accompanying drawings.

DESCRIPTION OF THE PREFERRED EMBODIMENTS

Figure 1:
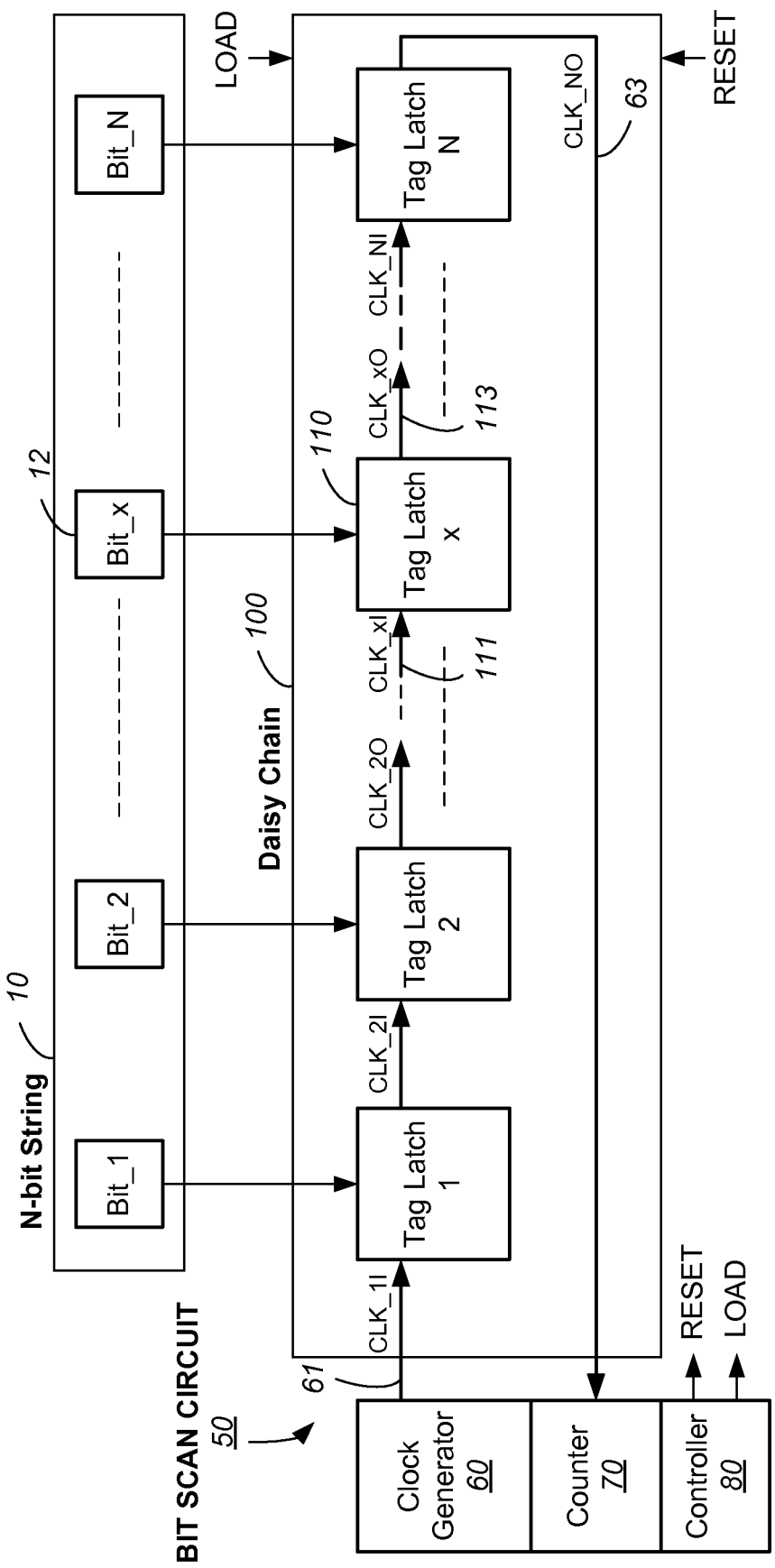
FIG. 1 illustrates a bit scan circuit according to one embodiment of the invention in which a gated clock is routed through a daisy chain of tag latch circuits.

FIG. 1 illustrates a bit scan circuit according to one embodiment of the invention in which a gated clock signal is routed through a daisy chain of tag latches. The bit scan circuit 50 is employed to scan the number of "1"s and/or "0"s in an N-bit string 10. The bit scan circuit comprises N tag latches such as tag latch_1, tag latch_2, . . . , tag latch_x 110, . . . , tag latch_N. Each tag latch, such as tag latch_x 110 has a clock input CLK_xI 111 and a clock output CLK_xO 113. A daisy chain 100 is formed with the N tag latches daisy-chained together by their clock inputs and clock outputs.

The daisy chain 100 has an input end 61 which is the clock input of the first tag latch_1 and an output end 63 which is the clock output of tag latch_N. A clock generator 60 generates a clock signal CLK_1I which is input to the tag latch daisy chain 100 via the input end 61. The output end 63 of the daisy chain outputs a clock signal CLK_NO, which is fed back to a counter 70.

As will be described in more detail in connection with FIG. 2, each tag latch_x 110 acts as a gate for an input clock signal CLK_xI. The transmission property of the gate is controlled by a tag bit. When the tag bit is at a "no-pass" value, the gate will block the input clock signal. When the tag bit is at a "pass" value, the gate will allow the input clock signal CLK_xI to pass through and outputs it as CLK_xO. For example, one coding of the tag bit has the "no-pass" value as "1" and the "pass" value as "0".

A controller 80 controls the operations of the scan bit circuit 50. When the controller issues a control signal RESET, the tag bits of the N latch circuits are reset to a default value, which corresponds to the "pass" value. When the controller issues a control signal LOAD, the N bits of the N-bit string 10 are loaded as loaded bits into respective N tag latches in the daisy chain 100.

The tag bit in each tag latch is initially set to the value of the loaded bit. Thus, for example, where the loaded bit is "0", then the tag bit is initially set to "0", causing the tag latch to be in a "pass" state, and where the loaded bit is "1", the tag latch is put in a "no-pass" state.

To began the operation of scanning for the number of "1"s in the N-bit string, the controller 80 inputs a clock signal in the form of a pulse train into the input end 61 of the daisy chain 100.

The pulse train will pass right through a tag latch when it is initially in a "pass" state (e.g., tag bit="pass"). On the other hand, the pulse train will be blocked by a tag latch when it is initially in a "no-pass" state (e.g., tag bit="no-pass"). Moreover, the leading pulse of the pulse train will interact with the tag latch initially in the "no-pass" state to reset it to the "pass" state (with its tag bit being reset from "no-pass" to "pass") in one period of the leading pulse. Therefore the pulse train will emerge from this tag latch with its leading pulse missing.

Thus, a "1" bit in the N-bit string will cause a corresponding tag latch to block a leading pulse of a pulse train entering it. When the pulse train emerges from the end of the daisy chain 100, the number of missing pulses will correspond to the number of "1"s in the N-bit string, as determined by the counter 70.

Within the daisy chain, a tag latch can be reset to the "pass" state only if all preceding latches are all at the "pass" state. The tag latch at the beginning of the chain has the highest priority, the tag latch at the end of the chain has the lowest priority.

If for example the N-bit string has N=16 and bit_1 to bit_5 are at "0", bit_6 to bit_7 are at "1", and bit_8 to bit_16 are at "0", i.e. {0000011000000000}, then the pulse train will basically race pass the first five tag latches ($1^{st}$ to $5^{th}$) until it reaches the 6th tag latch in the daisy chain 100. There, it will expend one pulse (the leading pulse) period to reset the 6th tag latch circuit to a "pass" state and emerge from the $6^{th}$ with its leading pulse missing. The same will happen in the 7th tag latch, expending yet another pulse period and losing another leading pulse. Then the pulse train will race pass the rest of the tag latch circuits from $8^{th}$ to $16^{th}$ and emerge from the daisy chain 100 with two pulses missing. This means there are two "1"s in the N-bit string.

Conventional daisy-chained latches such as the flip-flop type have the clock signal clocking through each and every latches. The present bit scan circuit is very efficient, in that the clock signal races pass all tag latch circuits in the "pass" state and only clocks those tag latch circuits in the "no-pass" state that correspond to the "1"s of interest in the N-bit string. In the example above, only 2 clock pulses are expended instead of 16 clock pulses.

Figure 2:
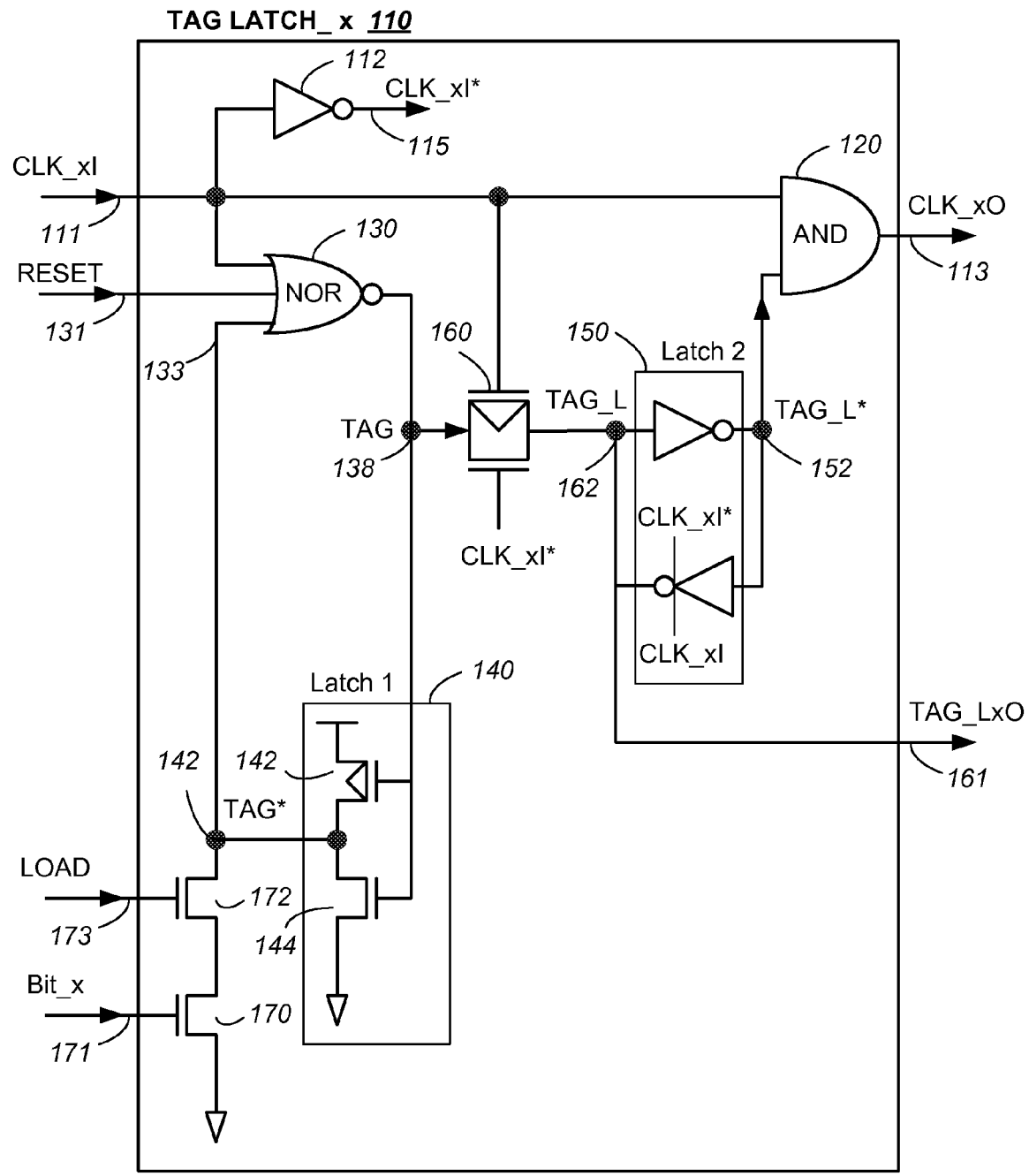
FIG. 2 illustrates in more detail an embodiment of the tag latch circuit of FIG. 1.

FIG. 2 illustrates in more detail an embodiment of the tag latch circuit of FIG. 1. Essentially, the tag latch circuit x 110 has an AND gate 120 that gates the input clock CLK_x1 using a possibly time-dependent gating signal TAG_L*. When the loaded bit with Bit_x=0 is loaded into the tag latch circuit x 110, TAG_L* is put in a "pass" state (e.g., "1") that enables the AND gate 120. On the other hand, when Bit_x=1, initially TAG_L* is put in a "no-pass" state that blocks the AND gate 120. Thereafter, TAG_L* is reset to the "pass" state by a leading pulse of CLK_x1 after one pulse period. In order to maintain state information before and after the pulse period, the tag latch 110 operates with internal signals TAG and TAG_L. The signal TAG is latched in latch 1 140 and the signal TAG_L is latched in latch 2 150.

Before the scan bit operation, the values of TAG and TAG_L are reset. This is accomplished by a RESET signal from the controller 80 (see FIG. 1) that feeds into one input 131 of three inputs of a NOR gate 130. The signal TAG, at a node 138, is an output of the NOR gate 130.

Figure 3:
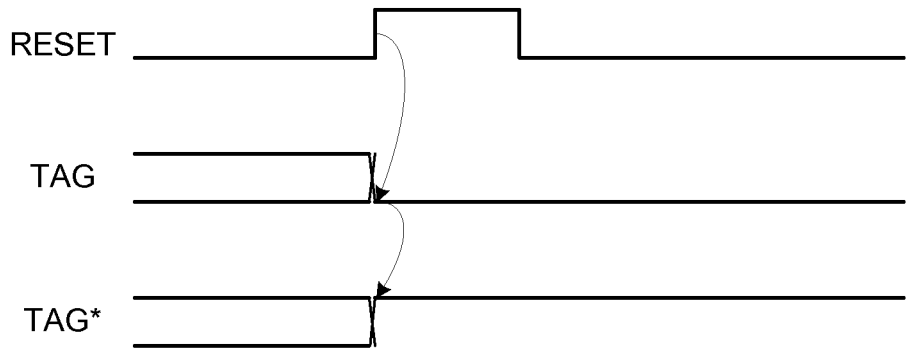
FIG. 3 illustrates timing diagrams for the RESET operation of the tag latch circuit shown in FIG. 2.

FIG. 3 illustrates timing diagrams for the RESET operation of the tag latch circuit shown in FIG. 2. When RESET is asserted (logic "1"), TAG at node 138 connected to the output of the NOR gate 130 becomes "0" and is latched in the latch 1 140. Latch 1 140 has a first inverter that operates with the NOR gate 130 acting as a second inverter in a feedback loop. The first inverter comprises of a p-transistor 142 sourced from Vcc and an n-transistor 144 sourced from ground. The p-transistor 142 has a slightly weaker drive capability than that of the n-transistor 144. The signal TAG drives the first inverter and outputs an inverted signal TAG* that is fed back via an input 133 to the NOR gate 130.

After reset, the tag latch circuit is in a "pass" state. This is accomplished by transferring the TAG signal via a transfer gate 160 to become the signal TAG_L and then to the inverted signal TAG_L* which gates the AND gate 120.

The transfer gate is controlled by CLK_xI and CLK_xI* (CLK_xI* is produced by inverting CLK_xI by an inverter 112) such that it is transferring when CLK_xI is "0" and not transferring when CLK_XI is "1". Thus, before the leading pulse of the CLK_xI enters the tag latch 110, the transfer gate 160 is in a transferring state. The transferred value of TAG is TAG_L at a node 162 and is latched in the latch 2 150. TAG_L is inverted at the output of the latch 2 150 as TAG_L* which is used to gate the AND gate 120. After reset, TAG=0 at node 138, and therefore TAG_L*=1, which is at a "pass" state.

Returning to FIG. 2, the xth bit of the N-bit string 10 (see FIG. 1) is loaded as a signal bit_x into the latch circuit 110 and sets the signal TAG at node 138 to be the inverse of bit_x. This is accomplished by two n-transistors 170 and 172 configured in series as a pull-down to the node 142 where TAG* exists. The two n-transistors are respectively controlled by two inputs 171, 173. The signal bit_x is on the first input 171 and a signal LOAD is on the second input 173.

After reset and when the controller 80 asserts LOAD, the n-transistor 172 is turned on. If bit_x=0, the node 142 is not pulled down and TAG*=1 (or TAG=0) is left undisturbed. This remains true even if CLK_xI is active since TAG at the output of the NOR gate 130 will always be at "0" whenever any one of its inputs is at "1" (e.g., TAG*=1). The tag latch remains at the "pass" state after reset. Thus, if bit_x=0, the tag latch is always in a "pass" state. When a pulse train of CLK_xI enters through the input 111 to the tag latch 110, it will be given passage through the AND gate 120 and exit out intact as the clock signal CLK_xO at the output 113.

On the other hand, if bit_x=1, the tag latch is initially in a "no-pass" state. When a pulse train of CLK_xI enters through the input 111 to the tag latch 110, it will initially be blocked at the AND gate 120.

Figure 4:
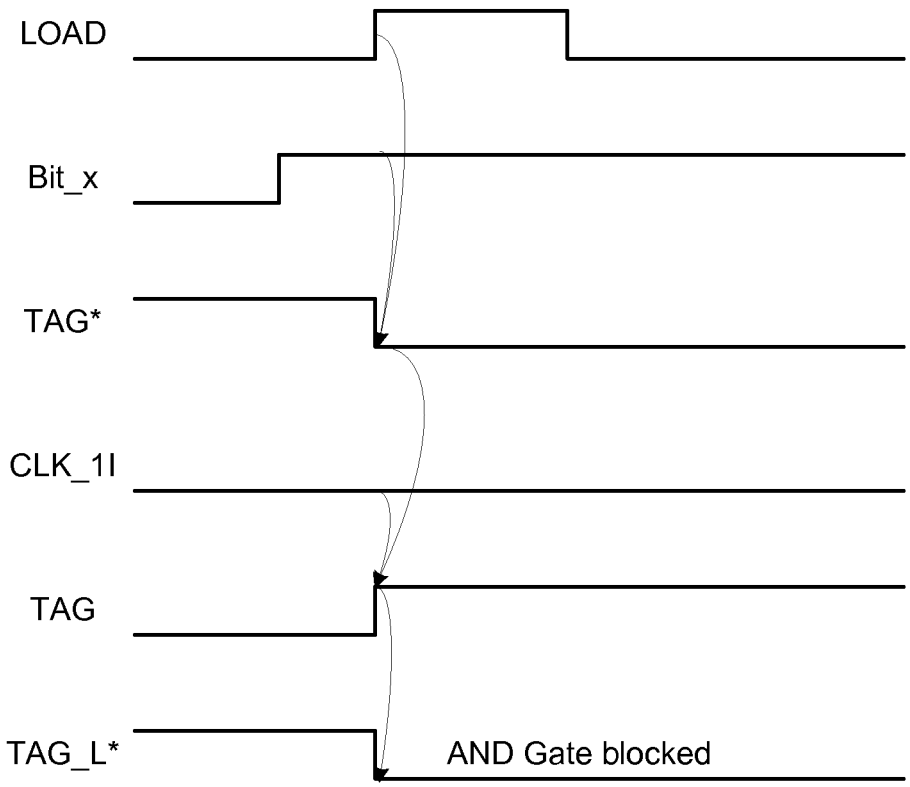
FIG. 4 illustrates timing diagrams for loading Bit_x into the tag latch circuit shown in FIG. 2.

FIG. 4 illustrates timing diagrams for loading bit_x into the tag latch circuit shown in FIG. 2. With both LOAD and bit_x at "1", TAG*=0. Since the NOR gate 130 has all its inputs at "0", it outputs TAG=1 at the node 138 and latches TAG in Latch 1 140. TAG=1 is transferred to TAG_L*=0, which means the tag latch 110 is in a "no-pass" state.

However, while being blocked, the leading pulse also interacts with the tag latch 110 to change the tag latch from the "no-pass" to "pass" state.

Figure 5:
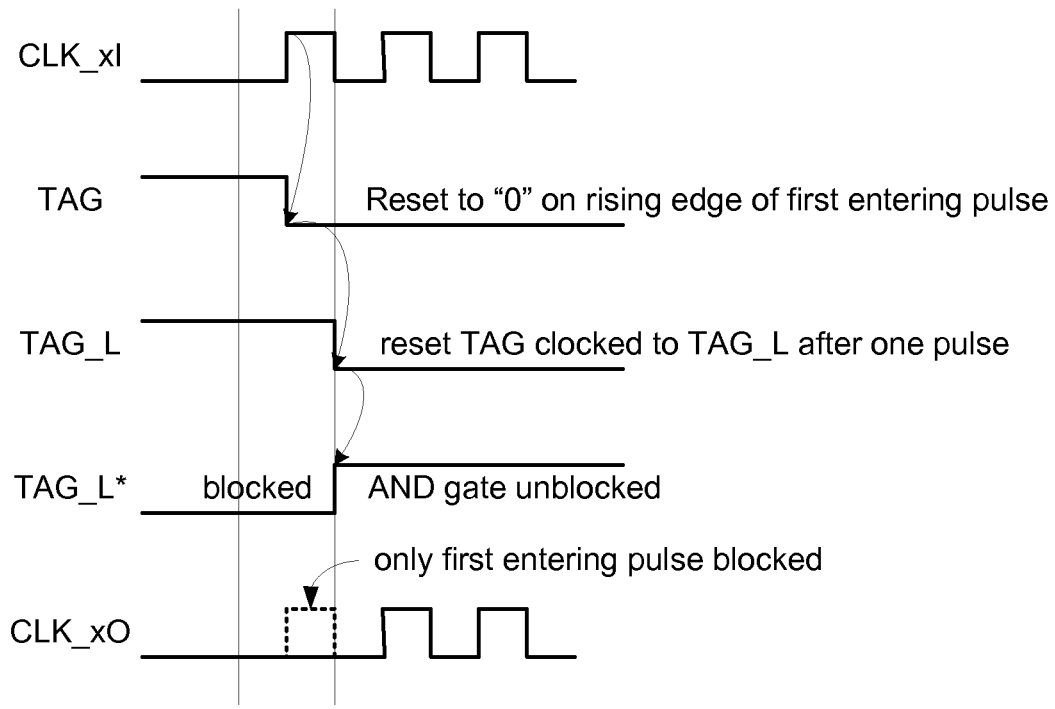
FIG. 5 illustrates timing diagrams for a leading pulse of a pulse train interacting with a tag latch initially in a "no-pass" state.

FIG. 5 illustrates timing diagrams for a leading pulse of a pulse train interacting with a tag latch initially in a "no-pass" state. As described before, when bit_x=1, initially TAG=1 and TAG_L*=0 and the tag latch 110 is initially in a "no-pass" state. When a leading pulse of the pulse train CLK_xI enters, it is blocked at the AND gate 120 and there is no clock signal emerging as CLK_xO from the output 113. While in the tag latch 110, the leading edge of the leading pulse of CLK_xI, rises to "1" and through input 111 to the NOR gate 130, the signal TAG is changed from "1" to "0". Since the transfer gate 160 is disabled when CLK_xI is at "1", TAG=0 is not transferred to TAG_L until one pulse later when CLK_xI goes to "0" and TAG_L*=1 is latched in latch 2 150. Thus, TAG_L* initially=0 and blocks the leading pulse at the AND gate 120, but after the leading pulse, TAG_L* is changed to "1" and allows passage of the CLK_xI minus one leading pulse through the AND gate 120. Thus, for a tag latch loaded with bit_x=1, CLK_xI emerges one pulse later from the tag latch x 110 as CLK_xO missing one pulse. On the other hand, for a tag latch loaded with bit_x=0, CLK_xI emerges intact and substantially instantaneously as CLK_xO.

In the embodiment of FIG. 1, the gated clock signal CLK_NO passes through the AND gate 120 of every tag latch 110 in the daisy chain 100. If for example, the daisy chain has 100 tag latch circuits and only bit_1=1 and the rest are at zero. This means there will be a one pulse delay at the first tag latch when the signal TAG_L* is at "1" for the period of the leading pulse. Thereafter, determining of the missing pulse is done since the rest of the 99 tag latches will not block any more pulses. Nevertheless in the first embodiment, the gated clock signal CLK_NO will still have to suffer accumulated gate delays of the remaining 99 AND gates in the daisy chain before emerging from the output end.

Figure 6:
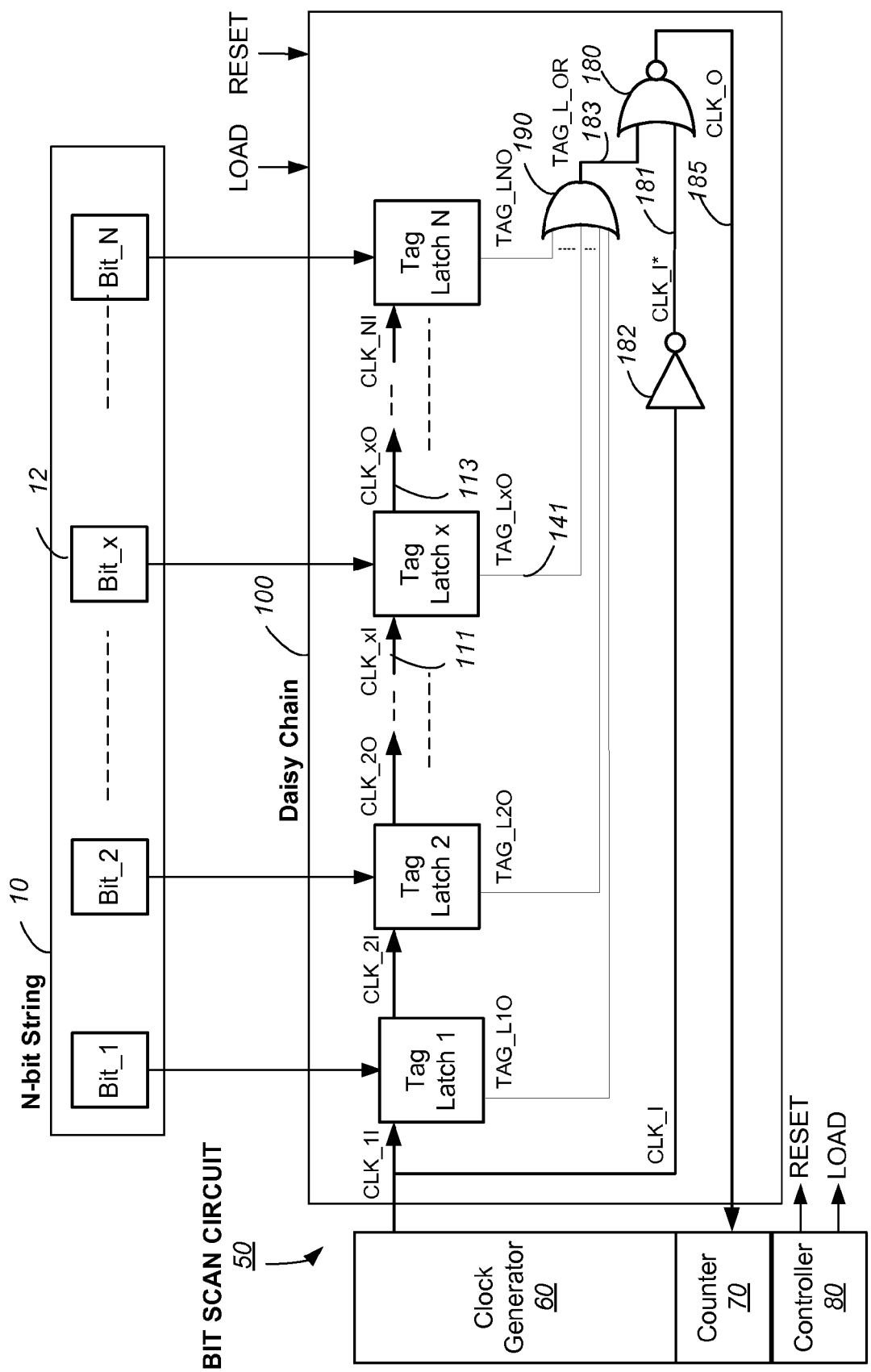
FIG. 6 illustrates the bit scan circuit according to another preferred embodiment of the invention in which the gated clock is routed outside the daisy chain of tag latch circuits.

FIG. 6 illustrates the bit scan circuit according to another preferred embodiment of the invention in which the gated clock signal that provides the count information is routed outside the daisy chain of tag latch circuits. In a more preferred embodiment, a branch CLK_I of the clock signal CLK_1I at the input end of the daisy chain 100 is gated outside the daisy chain. This is accomplished by a NOR gate 180 having two inputs 181 and 183 and an output 185. The clock signal CLK_I is inverted by an inverter 182 as CLK_I* and connected to the input 181 of the NOR gate 180. The input 183 is obtained from the output of an OR gate 190 which takes its inputs from the signal TAG Lx_O of each tag latch 110 of the daisy chain 100. As described before, when the tag latch has TAG_LxO=0, it is in a "pass" state. When it has TAG_LxO=1, it is in a "no-pass" state. Thus, the output of the OR gate 190 is "1" and will not change to "0" as long as the daisy chain still has a tag latch that is in a "no-pass" state not yet reset to a "pass" state. This will block the passage of CLK_I* through the NOR gate 180, resulting in pulses missing from the pulse train of CLK_O emerging from the output 185 of the NOR gate 180. The missing pulses are tallied by the counter 70 as before.

By using the timing signals of the TAG_LO from all the tag latches 110 of the daisy chain 100 to gate the pulse train of the gated clock signal outside the daisy chain, gate delays in the daisy chain are minimized.

Figure 7:
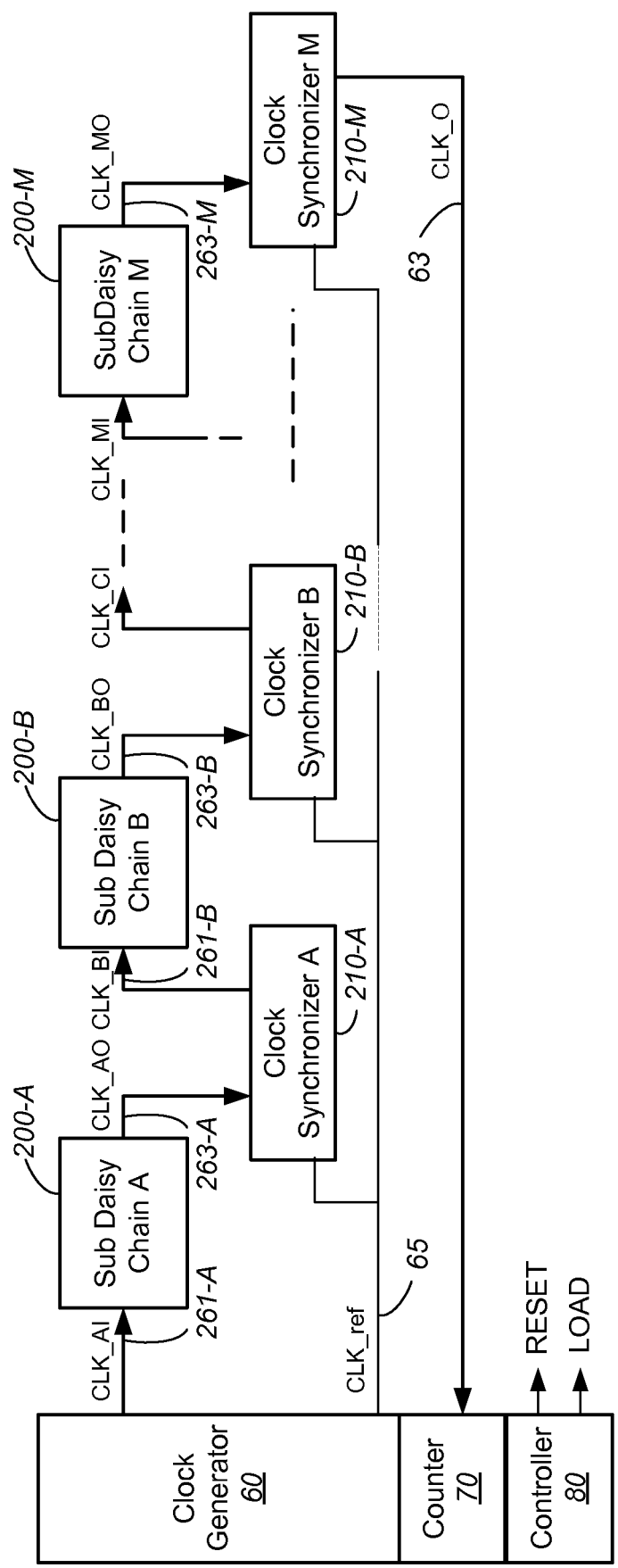
FIG. 7 illustrates the bit scan circuit being formed by a series of concatenated sub-daisy chains.

FIG. 7 illustrates the bit scan circuit being formed by a series of concatenated sub-daisy chains. As explained earlier the pulse train of the clock signal is run through the daisy chain to "interrogate" any tag latch in the "no pass" state and to reset it to the "pass" state. The pulse train will suffer accumulated gate delay as it passes through the AND gate 120 of the tag latches 110 in the daisy chain. If the accumulated gate delay is of the order of a pulse width, the counter 80 will not be able to determine correctly the exact number of missing pulses from CLK_O.

To control the timing shift due to the cumulative gate delays in the daisy chain, the number of tag latches N in the daisy chain should be limited. For example, N should be 64 or less. If a daisy chain of larger N is desired, the daisy chain of N tag latches is partitioned into smaller chains such as sub-daisy chain A, subdaisy chain B, . . . , subdaisy chain M that are linked together. In this way, the number of tag latches in each subdaisy chain can be controlled. For example, if N=256, then the original daisy chain can be partitioned into 4 concatenated subdaisy chains. The output of the gated clock signal from each subdaisy chain is resynchronized relative to a reference clock CLK_ref on a bus 65 by a clock synchronizer 210 before being fed into the next sub-daisy chain as an input clock. For example, a clock synchronizer A 210-A resynchronizes the output clock signal CLK_OA from sub-daisy chain A 200-A and inputs it as the input clock signal CLK_BI to the next subdaisy chain B 200-B in the link. The output gated clock signals of the other subdaisy chains are treated in the same manner. The gated clock output from the last subdaisy chain CLK_O is then sent to the counter 70 for counting the number of missing pulses. For example the counter 70 keeps track of all the pulses in the pulse train in the input clock CLK_I and detects the first pulse appearing in the gated clock and counts the number of missing pulses from the beginning up until the first appearing pulse.

Figure 8:
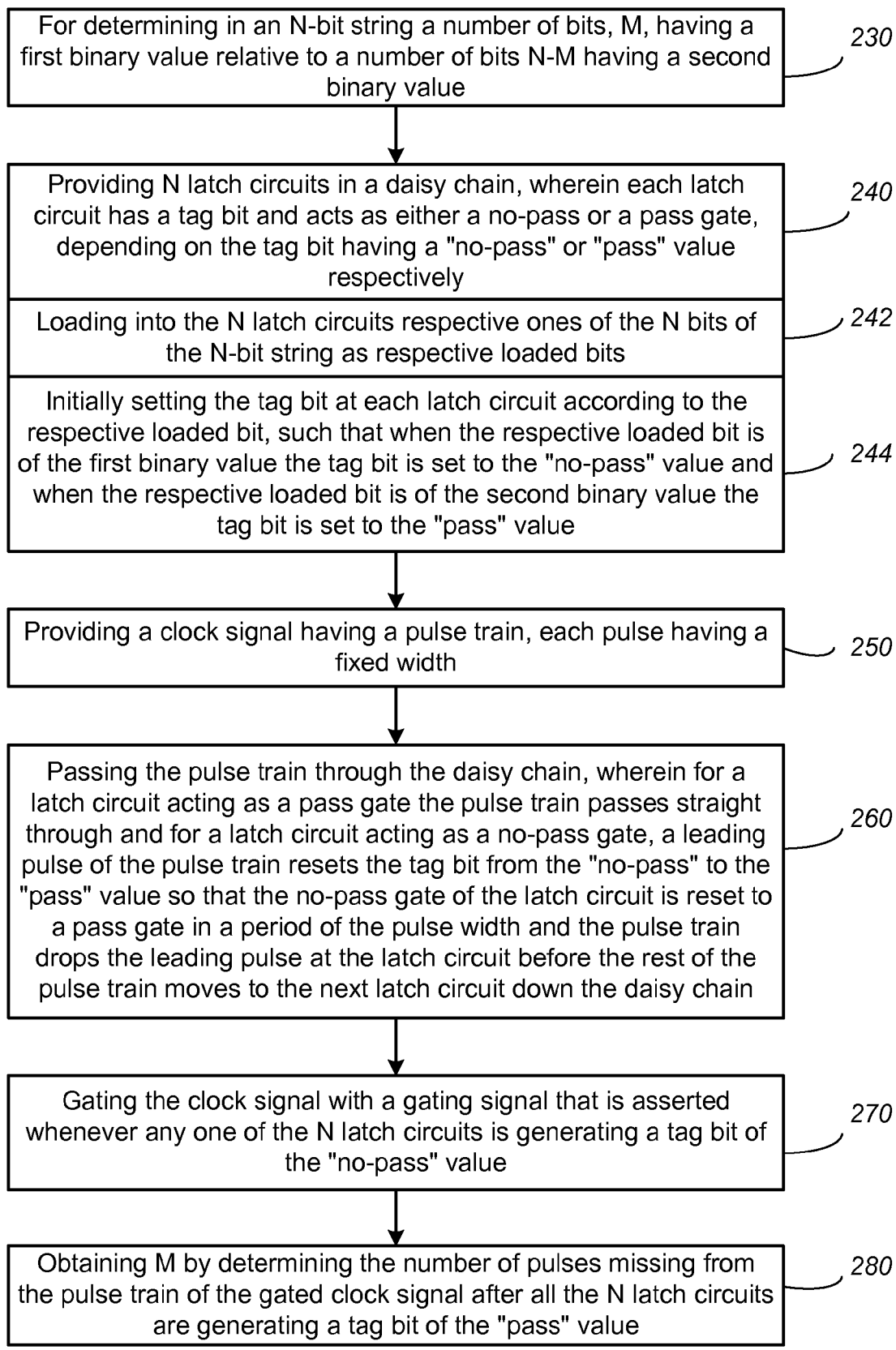
FIG. 8 is a flow diagram illustrates a method of performing bit scan.

FIG. 8 is a flow diagram illustrates a method of performing bit scan.

STEP 230: Begin determining in an N-bit string a number of bits, M, having a first binary value relative to a number of bits N−M having a second binary value.

STEP 240: Providing N latch circuits in a daisy chain, wherein each latch circuit has a tag bit and acts as either a "no-pass" or a "pass" gate, depending on the tag bit having a "no-pass" or "pass" value respectively.

STEP 242: Loading into the N latch circuits respective ones of the N bits of the N-bit string as respective loaded bits.

STEP 244: Initially setting the tag bit at each latch circuit according to the respective loaded bit, such that when the respective loaded bit is of the first binary value the tag bit is set to the "no-pass" value and when the respective loaded bit is of the second binary value the tag bit is set to the "pass" value.

STEP 250: Providing a clock signal having a pulse train, each pulse having a fixed width.

STEP 260: Passing the pulse train through the daisy chain, wherein for a latch circuit acting as a pass gate the pulse train passes straight through and for a latch circuit acting as a no-pass gate, a leading pulse of the pulse train resets the tag bit from the "no-pass" to the "pass" value so that the no-pass gate of the latch circuit is reset to a pass gate in a period of the pulse width and the pulse train drops the leading pulse at the latch circuit before the rest of the pulse train moves to the next latch circuit down the daisy chain.

STEP 270: Gating the clock signal with a gating signal that is asserted whenever any one of the N latch circuits is generating a tag bit of the "no-pass" value.

STEP 280: Obtaining M by determining the number of pulses missing from the pulse train of the gated clock signal after all the N latch circuits are generating a tag bit of the "pass" value.

Memory System

Figure 9:
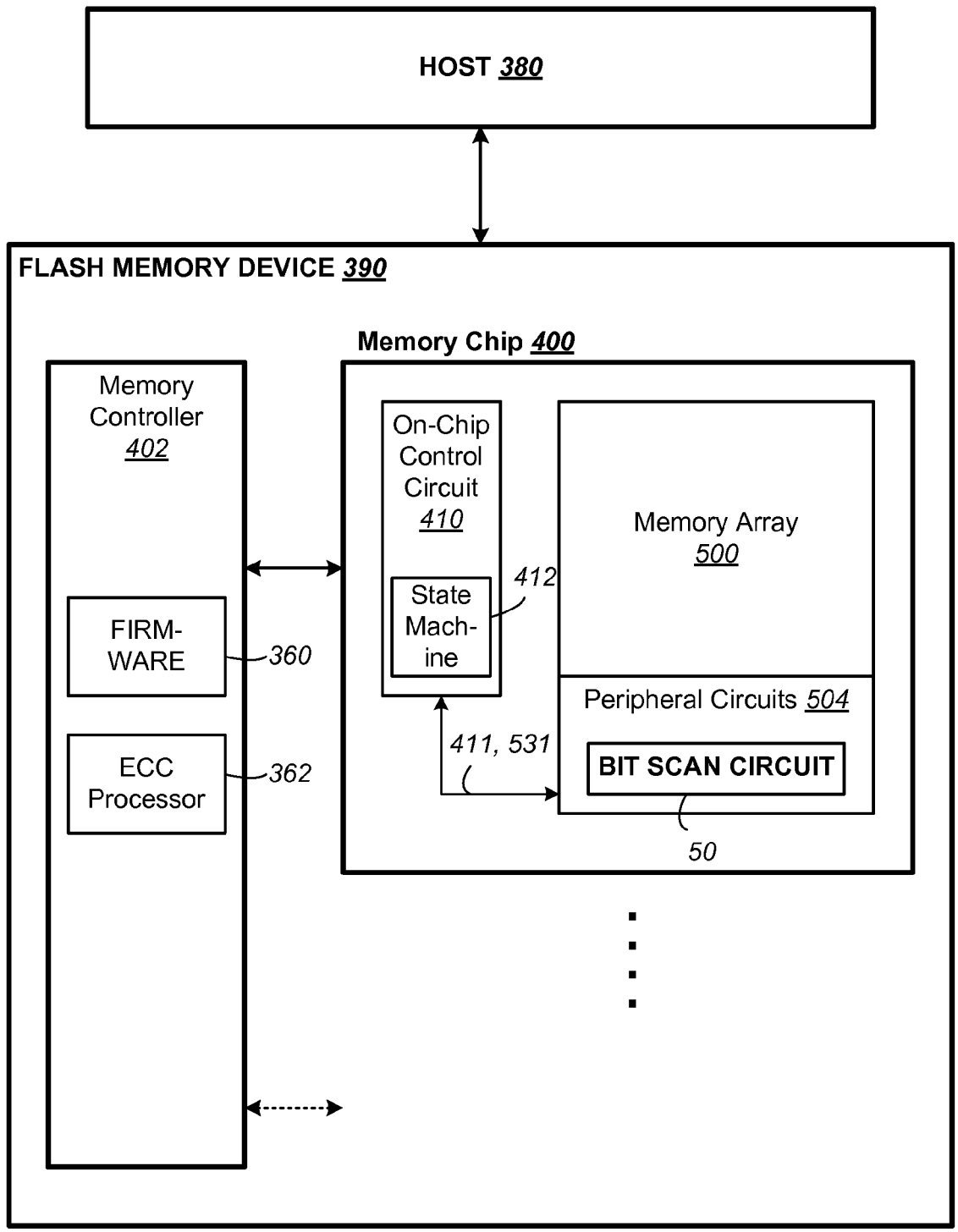
FIG. 9 illustrates a host in communication with a memory device in which the features of the present invention are embodied.

FIG. 9 illustrates a host in communication with a memory device in which the features of the present invention are embodied. The host 380 typically sends data to be stored at the memory device 390 or retrieves data by reading the memory device 390. The memory device 390 includes one or more memory chip 400 managed by a memory controller 402. The memory chip 400 includes a memory array 500 of memory cells with each cell capable of being configured as a multi-level cell ("MLC") for storing multiple bits of data, as well as capable of being configured as a single-level cell ("SLC") for storing 1 bit of data. The memory chip also includes peripheral circuits 504 such as row and column decoders, sense modules, data latches and I/O circuits. An on-chip control circuitry 410 controls low-level memory operations of each chip. The control circuitry 410 is an on-chip controller that cooperates with the peripheral circuits to perform memory operations on the memory array 500. The control circuitry 410 typically includes a state machine 412 to provide chip level control of memory operations via a data bus 531 and control and address bus 411.

In many implementations, the host 380 communicates and interacts with the memory chip 100 via the memory controller 402. The controller 402 co-operates with the memory chip and controls and manages higher level memory operations. A firmware 360 provides codes to implement the functions of the controller 402. An error correction code ("ECC") processor 362 processes ECC during operations of the memory device.

For example, in a host write, the host 380 sends data to be written to the memory array 500 in logical sectors allocated from a file system of the host's operating system. A memory block management system implemented in the controller stages the sectors and maps and stores them to the physical structure of the memory array. A preferred block management system is disclosed in United States Patent Application Publication Number: US-2010-0172180-A1, the entire disclosure of which is incorporated herein by reference.

Physical Memory Architecture

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Figure 10:
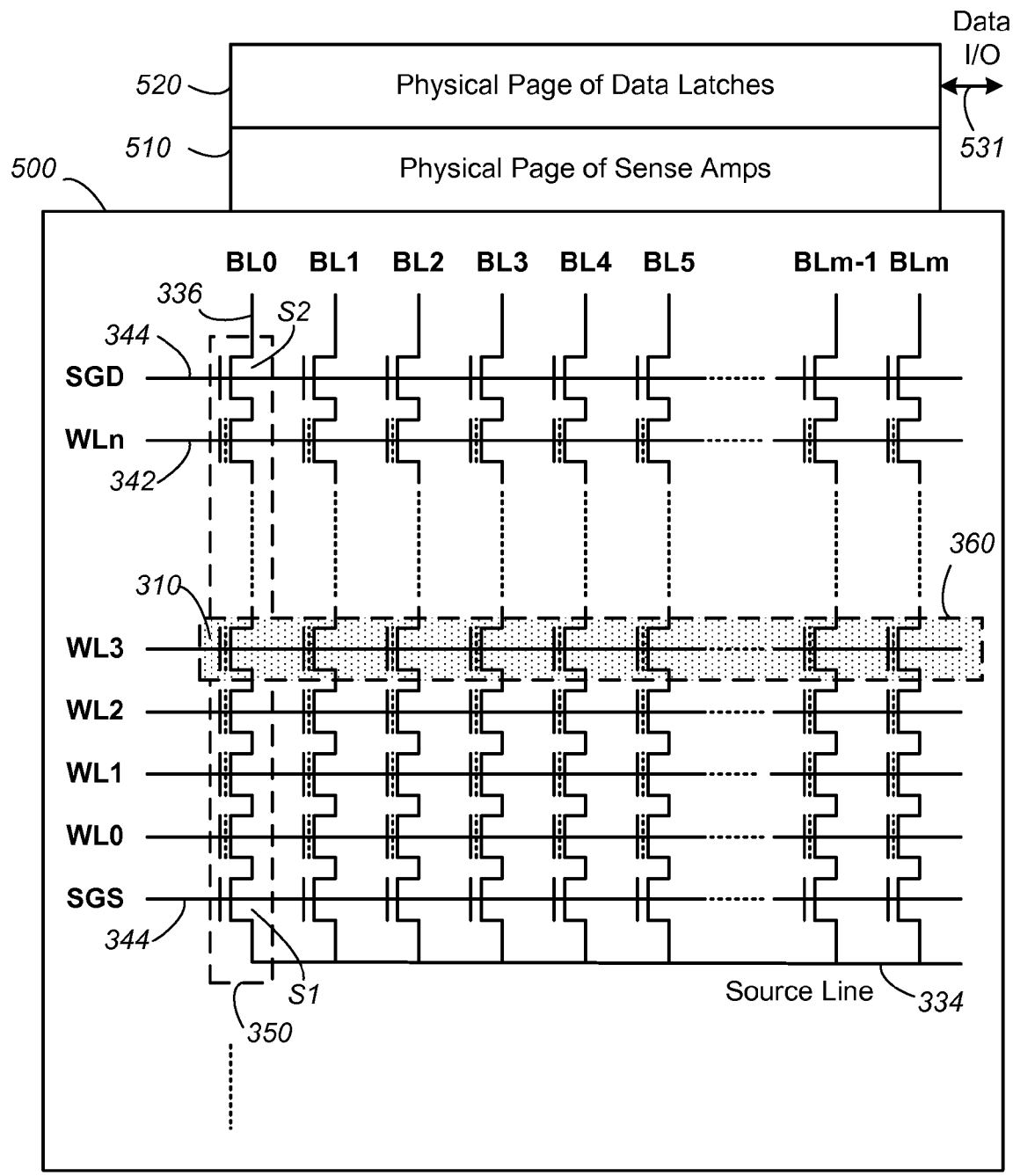
FIG. 10 illustrates a page of memory cells, organized for example in the NAND configuration, being sensed or programmed in parallel.

FIG. 10 illustrates a page of memory cells, organized for example in the NAND configuration, being sensed or programmed in parallel. FIG. 10 essentially shows a bank of NAND strings 350 in the memory array 500 of FIG. 9. A "page" such as the page 360, is a group of memory cells enabled to be sensed or programmed in parallel. This is accomplished in the peripheral circuits by a corresponding page of sense amplifiers 510. The sensed results are latches in a corresponding set of data latches 520. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each cell such as cell 10 is accessible by a sense amplifier via a bit line 336. Data in the data latches 520 are toggled in from or out to the memory controller 402 via a data I/O bus 531.

The page referred to above is a physical page memory cells or sense amplifiers. Depending on context, in the case where each cell is storing multi-bit data, each physical page has multiple data pages.

The NAND string 350 is a series of memory transistors 310 daisy-chained by their sources and drains to form a source terminal and a drain terminal respective at its two ends. A pair of select transistors S1, S2 controls the memory transistors chain's connection to the external via the NAND string's source terminal and drain terminal respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory transistor 10 in the chain acts as a memory cell. It has a charge storage element 320 to store a given amount of charge so as to represent an intended memory state. A control gate of each memory transistor allows control over read and write operations. The control gates of corresponding memory transistors of a row of NAND string are all connected to the same word line (such as WL0, WL1, . . . ) Similarly, a control gate of each of the select transistors S1, S2 (accessed via select lines SGS and SGD respectively) provides control access to the NAND string via its source terminal and drain terminal respectively.

Figure 11:
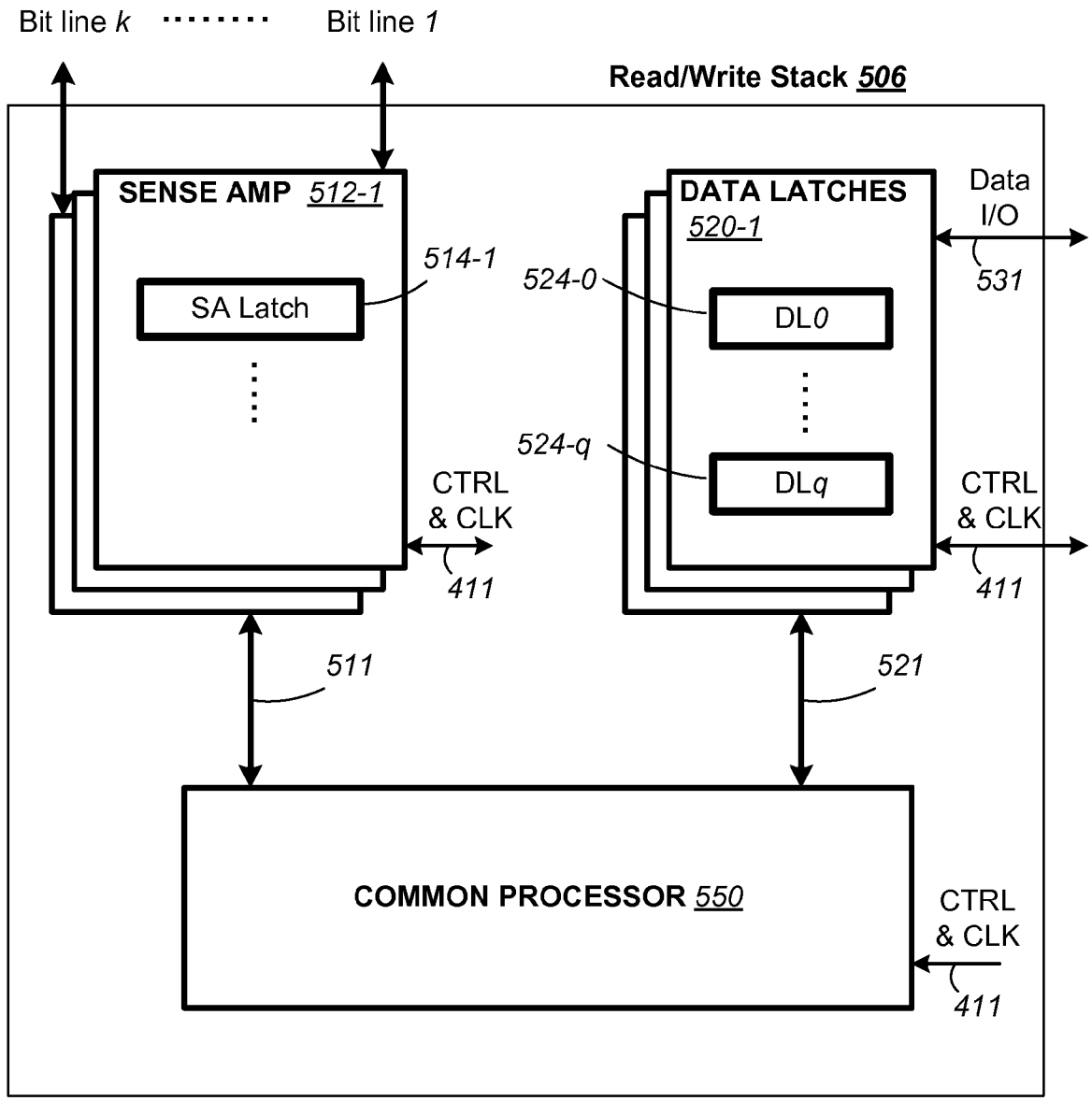
FIG. 11 is a functional block diagram of read/write circuits in the peripheral circuits of FIG. 10.

FIG. 11 is a functional block diagram of read/write circuits in the peripheral circuits of FIG. 10. The read/write circuits 506 include sense amplifiers 512, data latches 520 and a common processor 550. The I/O circuits are coupled to the data latches and not shown explicitly except of a data I/O bus 531. In the embodiment shown, the sense amplifiers and data latches are organized into read/write stacks 506, with each stack serving k memory cells via the bit lines 1 to k, which is a subset of a page in parallel. There are a plurality of such read/write stacks to service the entire pare in parallel. In this way, the number of the common processor 550 for the page is reduced. Each stack 506 contains a stack of sense amplifiers 512-1 to 512-k and a stack of data latches 520-1 to 520-k. The stack of sense amplifiers and the stack of data latches share the common processor 550 which is able to process data among them. The sense amplifiers 512 communicate with the common processor 250 via a bus 211. The data latches 520 communicate with the common processor 550 via a bus 521. At any one time the common processor 550 processes the data related to a given memory cell. For example, for the memory cell coupled to bit line 1, the corresponding sense amplifier 512-1 latches the data sensed from the memory cell into a sense amplifier latch, SA Latch 514-1. Similarly, the corresponding set of data latches 520-1 stores input or output data associated with the memory cell coupled to bit line 1. In the preferred embodiment, the set of data latches 520-1 comprises a set of data latches, 524-0, ..., 524-q or respectively DL0, DL1, ..., DLq for storing (q+1)-bits of information. The read/write stack 506 is controlled by the on-chip control circuit via control and address bus 411 and exchange data with the memory controller 402 via the data I/O bus 531 (see also FIG. 1).

The page of memory cells shares a common word line and each memory cell of the page is coupled via bit line to a sense amplifier. When the page of memory cells is read or written, it is also referred to as being read from or written to the word line associated with the page of memory cells. Similarly, the data associated with the page of memory cell is referred to as a page of data.

Such read/write circuits have been described in U.S. Pat. No. 7,471,575, the entire disclosure of which is incorporated herein by reference.

High density Non-volatile memory, like NAND flash memory can have many failure bits especially used in multi bit per cell mode. A failure bits count circuit is used for non-volatile memory program. This bit counting process can impact program speed.

In a programming operation, a page of program data (for example, 8 k or 16 k bytes) is first stored in a corresponding set of data latches such as DL1-1 to DL1-k. A corresponding physical page of memory cell is then programmed and verified according to the program data. Thereafter, the page of data in the programmed cells can be read and stored in a corresponding set of data latches such DL2-1 to DL2-k. The common processor 250 performs an XOR operation between the program data and the read data and any mismatch will show up as "1"s in a resulting k-bit string.

For example, if the ECC is designed to correct a predetermined number z of bit errors in the page, then the page's bit error must not exceed z. This would require a quick determination if the number of "1" in the XOR'ed result string exceeds z. If so, the same program data in the data latch can be used to retry the programming in another memory location.

In conventional implementations, counting the errors in a data page is achieved by transferring 8 bit data of a failure byte into a global bus and pre-charging and discharging that 8 bit bus. Each failure byte needs 9 clock cycles to count. The failure bit numbers ranged from 1 to 8 will be added into an 8 bits accumulator and then compare with a predefined failure budget. Another method is to perform a binary search on the string for "1"s. The whole bit count process is very timing consuming and could impact NAND memory program performance.

Thus, the bit scan circuit 50 described earlier is useful in performing these type of operation in the memory device. As illustrated in FIG. 9, one example is to incorporate such a bit scan circuit among the peripheral circuits 504 of the memory chip 100. Another example (not shown) is to incorporate such a bit scan circuit in the memory controller 402.

In the present invention, each clock cycle can reset one bit failure. Within the TAG latch chain, a TAG latch can be reset to "0" only if all preceding latches are all "0". The latch at the beginning of the chain has the highest priority, the latch at the end of the chain has the lowest priority.

The counter 70 (see FIG. 7) counts until the entire concatenated daisy chain has no tag latch in "no-pass" state and then stop the bit count. A new set of bits can be loaded to the concatenated daisy chain and the bit scan process is repeated until all 8K bytes page data is scanned.

In one embodiment, in the case where the ECC engine is designed to correct up to z number of error bits, when the counter 70 detects that the number of failed bits has reached the number z, it will prematurely terminate the counting in the bit scan circuit. This status will be communicated to the memory control circuit 410 so that reprogramming of the page can take place without further delay.

The present invention does not need accumulator, comparator and many other complicated timing control circuit. Furthermore, the bit scan circuit is quite simple relative to conventional ones with substantial reduction in transistors.

While the embodiments of this invention that have been described are the preferred implementations, those skilled in the art will understand that variations thereof may also be possible. Therefore, the invention is entitled to protection within the full scope of the appended claims.

It is claimed:

1. A method of determining in an N-bit string a number of bits, M, having a first binary value relative to a number of bits N–M having a second binary value, comprising:
   providing N latch circuits in a daisy chain, wherein each latch circuit has a tag bit and acts as either a no-pass or a pass gate, depending on the tag bit having a "no-pass" or "pass" value respectively;
   loading into the N latch circuits respective ones of the N bits of the N-bit string as respective loaded bits;
   initially setting the tag bit at each latch circuit according to the respective loaded bit, such that when the respective loaded bit is of the first binary value the tag bit is set to the "no-pass" value and when the respective loaded bit is of the second binary value the tag bit is set to the "pass" value;
   providing a clock signal having a pulse train, each pulse having a fixed width;
   passing the pulse train through the daisy chain, wherein for a latch circuit acting as a pass gate the pulse train passes straight through and for a latch circuit acting as a no-pass gate, a leading pulse of the pulse train resets the tag bit from the "no-pass" to the "pass" value so that the no-pass gate of the latch circuit is reset to a pass gate in a period of the pulse width and the pulse train drops the leading pulse at the latch circuit before the rest of the pulse train moves to the next latch circuit down the daisy chain;
   gating the clock signal with a gating signal that is asserted whenever any one of the N latch circuits is generating a tag bit of the "no-pass" value; and
   obtaining M by determining the number of pulses missing from the pulse train of the gated clock signal after all the N latch circuits are generating a tag bit of the "pass" value.

2. The method as in claim 1, wherein the clock signal being gated is the clock signal passing through the daisy chain.

3. The method as in claim 1, wherein the clock signal being gated is separate from the clock signal passing through the daisy chain.

4. The method as in claim 3, further comprising:
   providing an OR gate having N inputs and an output; and
   generating the gating signal from the output of the OR gate by inputting the tag bit values of the N latch circuits to respective inputs of the OR gate.

5. The method as in claim 3, further comprising:
   providing an AND gate having first and second inputs and an output; and obtaining the gated the clock signal from the output of the AND gate by inputting the clock signal to the first input of the AND gate and the gating signal to the second input of the AND gate.

6. The method as in any one of claims 1 to 5, further comprising:
partitioning the daisy chain into a plurality of sub-daisy-chains;
providing a reference clock signal; and
resynchronizing a clock signal output from each sub-daisy-chain relative to the reference clock signal before inputting to a next sub-daisy-chain.

7. The method as in claim 1, further comprising:
stopping the pulse train when a pulse has been detected in the gated clock signal.

8. The method as in claim 1, wherein each bit of the N-bit string is obtained from an XOR operation between two data bits under comparison in a non-volatile memory.

9. The method as in claim 8, wherein a first of the two data bits under comparison is a data bit to be programmed to a memory cell of the non-volatile memory and a second of the two data bits is a data bit read from the memory cell after being programmed.

10. The method as in claim 1, wherein when M is expected to be less than N−M, and the "no-pass" value of the tag bit corresponds to the first binary value.

11. A circuit for determining in an N-bit string a number of bits, M, having a first binary value relative to a number of bits N−M having a second binary value, comprising:
N latch circuits in a daisy chain, wherein each latch circuit has a tag bit and acts as either a no-pass or a pass gate, depending on the tag bit having a "no-pass" or "pass" value respectively;
a storage in each of the N modules for storing the respective N bits of the N-bit string as respective loaded bits;
a controller for generating control signals;
wherein responsive to a first control signal the tag bit at each latch circuit are initially set according to the respective loaded bit, such that when the respective loaded bit is of the first binary value the tag bit is set to the "no-pass" value and when the respective loaded bit is of the second binary value the tag bit is set to the "pass" value;
a clock generator for providing a clock signal having a pulse train, each pulse having a fixed width;
wherein on passing the pulse train through the daisy chain, for a latch circuit acting as a pass gate the pulse train passes straight through and for a latch circuit acting as a no-pass gate, the tag bit is reset by a leading pulse of the pulse train from the "no-pass" to the "pass" value so that the no-pass gate of the latch circuit is reset to a pass gate in a period of the pulse width;
a clock-signal gate for gating the clock signal with a gating signal that is asserted whenever any one of the N latch circuits is generating a tag bit of the "no-pass" value; and
a counter to determine M by a number of pulses missing from the pulse train of the gated clock signal after all the N latch circuits are generating a tag bit of the "pass" value.

12. The circuit as in claim 11, wherein the clock signal being gated is the clock signal passing through the daisy chain.

13. The circuit as in claim 11, wherein the clock signal being gated is separate from the clock signal passing through the daisy chain.

14. The circuit as in claim 13, further comprising:
an OR gate having N inputs and an output; and wherein
the gating signal is obtained from the output of the OR gate after the tag bit values of the N latch circuits are input to respective inputs of the OR gate.

15. The circuit as in claim 13, further comprising:
an AND gate having first and second inputs and an output; and wherein
the gated the clock signal is obtained from the output of the AND gate by the clock signal being input to the first input of the AND gate and the gating signal to the second input of the AND gate.

16. The circuit as in any one of claims 11 to 15, further comprising:
the daisy chain being partitioned into a plurality of sub-daisy-chains;
a reference clock signal; and
a resynchronizer module for resynchronizing a clock signal output from each sub-daisy-chain relative to the reference clock signal before the clock signal is input to a next sub-daisy-chain.

17. The circuit as in claim 11, further comprising:
the controller stopping the pulse train when a pulse has been detected in the gated clock signal.

18. The circuit as in claim 11, wherein each bit of the N-bit string is obtained from an XOR operation between two data bits under comparison in a non-volatile memory.

19. The circuit as in claim 18, wherein a first of the two data bits under comparison is a data bit to be programmed to a memory cell of the non-volatile memory and a second of the two data bits is a data bit read from the memory cell after being programmed.

20. The circuit as in claim 11, wherein when M is expected to be less than N−M, and the "no-pass" value of the tag bit corresponds to the first binary value.

* * * * *